(12) United States Patent
Choi et al.

(10) Patent No.: US 11,790,979 B2
(45) Date of Patent: Oct. 17, 2023

(54) MEMORY DEVICE PERFORMING READ OPERATION AND OPERATING METHOD OF THE MEMORY DEVICE

(71) Applicant: SK hynix Inc., Icheon-si (KR)

(72) Inventors: Gil Bok Choi, Icheon-si (KR); Dae Hwan Yun, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 9 days.

(21) Appl. No.: 17/364,137

(22) Filed: Jun. 30, 2021

(65) Prior Publication Data
US 2022/0208246 A1     Jun. 30, 2022

(30) Foreign Application Priority Data
Dec. 28, 2020    (KR) .......................... 10-2020-0185074

(51) Int. Cl.
| | |
|---|---|
| *G11C 11/408* | (2006.01) |
| *G11C 7/10* | (2006.01) |
| *G11C 11/4096* | (2006.01) |
| *G11C 11/4074* | (2006.01) |

(52) U.S. Cl.
CPC ........ *G11C 11/4085* (2013.01); *G11C 7/1063* (2013.01); *G11C 11/4074* (2013.01); *G11C 11/4096* (2013.01)

(58) Field of Classification Search
CPC ............ G11C 11/4085; G11C 11/4074; G11C 11/4096; G11C 7/1063; G11C 8/12; G11C 16/0483; G11C 16/32; G11C 16/08; G11C 16/26; G11C 16/30; Y02D 10/00
See application file for complete search history.

(56) References Cited

U.S. PATENT DOCUMENTS

| | | | |
|---|---|---|---|
| 11,139,030 B1 * | 10/2021 | Prakash ............. | G11C 16/3422 |
| 2010/0149895 A1 * | 6/2010 | Kim ....................... | B82Y 10/00 |
| | | | 365/207 |

FOREIGN PATENT DOCUMENTS

KR       1020150082261 A      7/2015

\* cited by examiner

*Primary Examiner* — Sultana Begum
(74) *Attorney, Agent, or Firm* — WILLIAM PARK & ASSOCIATES LTD.

(57) ABSTRACT

The present disclosure relates to an electronic device. A memory device according to the present disclosure includes a memory block coupled to a plurality of local word lines, a peripheral circuit configured to couple the plurality of local word lines to a plurality of global word lines and configured to perform an operation on the memory block, and a control logic configured to control the peripheral circuit to cause or increase a leakage current of the pass switch circuit to discharge potential levels of the plurality of local word lines when the memory device enters a ready state after the operation.

19 Claims, 13 Drawing Sheets

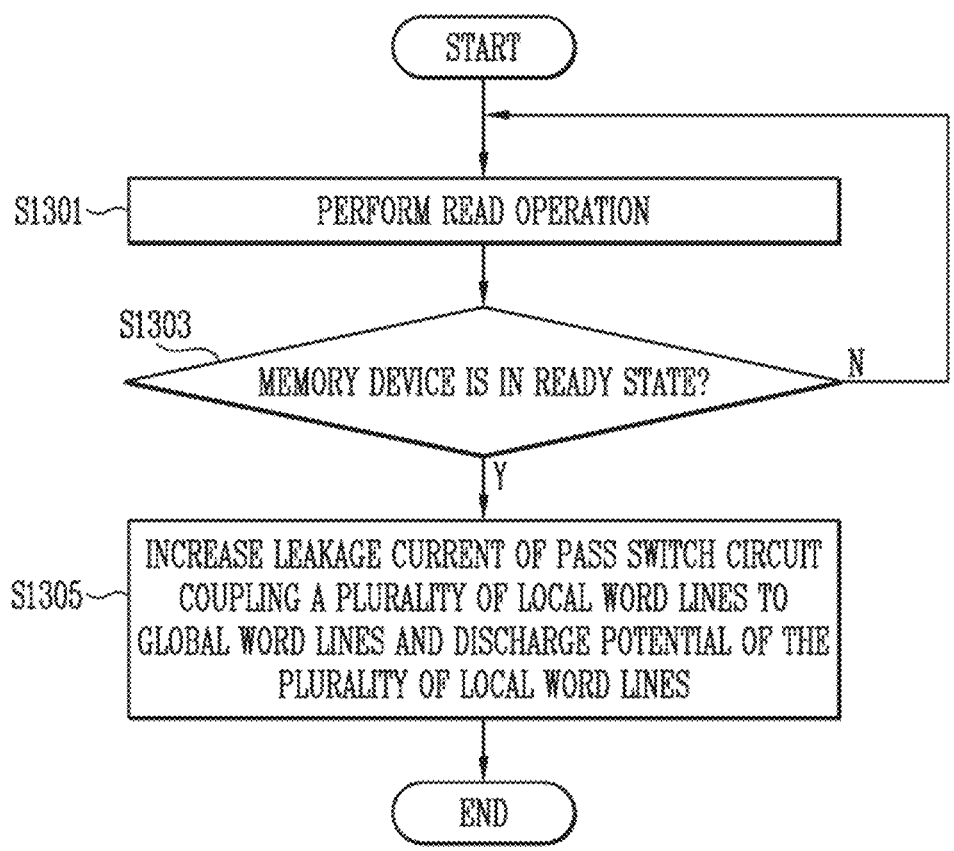

MEMORY DEVICE PERFORMING READ OPERATION AND OPERATING METHOD OF THE MEMORY DEVICE

CROSS-REFERENCE TO RELATED APPLICATION

The present application claims priority under 35 U.S.C. § 119(a) to Korean patent application number 10-2020-0185074 filed on Dec. 28, 2020, in the Korean Intellectual Property Office, the entire disclosure of which is incorporated by reference herein.

BACKGROUND

1. Technical Field

Various embodiments of the invention relate generally to an electronic device, and more particularly, to a memory device and an operating of the memory device of the semiconductor device.

2. Related Art

A storage device is configured to store data in response to control of a host device such as a computer or a smartphone. A storage device may include a memory device that stores data and a memory controller controlling the memory device. Memory devices may be divided into volatile memory devices and non-volatile memory devices.

A volatile memory device may retain data as long as power is being supplied, and may lose the stored data in the absence of power supply. Types of the volatile memory device may include Static Random Access Memory (SRAM), Dynamic Random Access Memory (DRAM), and the like.

A non-volatile memory device might not lose data even in the absence of power supply. Types of the non-volatile memory device may include Read Only Memory (ROM), Programmable ROM (PROM), Electrically Programmable ROM (EPROM), Electrically Erasable and Programmable ROM (EEPROM) and flash memory.

SUMMARY

According to an embodiment, a memory device may include a memory block coupled to a plurality of local word lines, a peripheral circuit configured to couple the plurality of local word lines to a plurality of global word lines through a pass switch circuit and configured to perform an operation on the memory block, and control logic configured to control the peripheral circuit to cause or increase a leakage current of the pass switch circuit to discharge potential levels of the plurality of local word lines when the memory device enters a ready state after the operation.

According to an embodiment, a method of operating a memory device may include performing an operation on a memory block coupled to a plurality of local word lines, and causing or increasing a leakage current of a pass switch circuit coupling the plurality of local word lines to a plurality of global word lines and discharging potential levels of the plurality of local word lines when a memory device enters a ready state.

According to an embodiment, a memory device lay include a memory block coupled to a plurality of local word lines, and a peripheral circuit configured to couple the plurality of local word lines to a plurality of global word lines through of a plurality of pass transistors, configured to perform a read operation on the memory block, and, configured to discharge potential levels of the plurality of local word lines by precharging or floating body regions of the plurality of pass transistors when the memory device enters a ready state after the read operation. The precharging or floating the body regions causes or increases a leakage current of the plurality of pass transistors.

BRIEF DESCRIPTION OF THE DRAWINGS

FIG. 13 is a timing diagram illustrating operations of a memory device according to an embodiment of the present disclosure.

DETAILED DESCRIPTION

Specific structural or functional descriptions of examples of embodiments in accordance with concepts which are disclosed in this specification are illustrated only to describe the examples of embodiments in accordance with the concepts and the examples of embodiments in accordance with the concepts may be carried out by various forms but the descriptions are not limited to the examples of embodiments described in this specification.

Various embodiments may be directed to a memory device having improved read reclaim performance and an operating method of the memory device.

Figure 1:
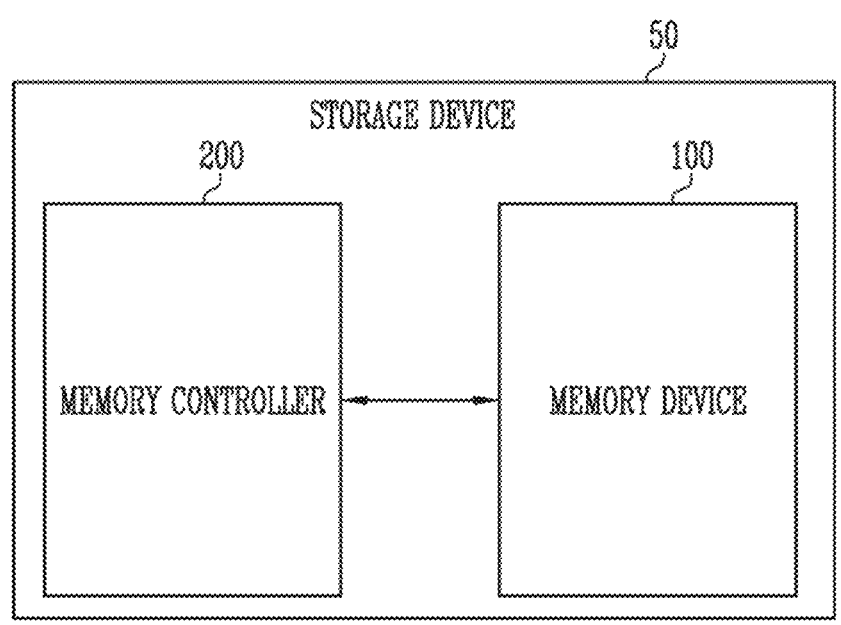
FIG. 1 is a diagram illustrating a storage device according to an embodiment of the present disclosure.

FIG. 1 is a diagram illustrating a storage device 50 according to an embodiment of the present disclosure.

Referring to FIG. 1, the storage device 50 may include a memory device 100 and a memory controller 200 that controls operations of the memory device 100. The storage device 50 may be configured to store data in response to control of a host. Examples of the storage device 50 may include a cellular phone, a smartphone, an MP3 player, a laptop computer, a desktop computer, a game player, a TV, a tablet PC, or an in-vehicle infotainment system.

The storage device 50 may be manufactured as one of various types of storage devices according to a host interface corresponding to a communication method with the host. For example, the storage device 50 may be configured as any one of various kinds of storage devices such as a solid state drive (SSD), a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-E) card type storage device, a compact flash (CF) card, a smart media card, and a memory stick.

The storage device 50 may be manufactured as any one of various types of packages. For example, the storage device 50 may be manufactured as any one of various kinds of package types, such as a package-on-package (POP), a system-in-package (SIP), a system-on-chip (SOC), a multichip package (MCP), a chip-on-board (COB), a wafer-level fabricated package (WFP), and a wafer-level stack package (WSP).

The memory device 100 may store data. The memory device 100 may operate in response to control of the memory controller 200. The memory device 100 may include a memory cell array including a plurality of memory cells that store data.

Each of the memory cells may be a single level cell (SLC) that stores 1 hit of data, a multi-level cell (MLC) that stores 2 bits of data, a triple-level cell (TLC) that stores 3 bits of data, and a quadruple level cell (QLC) that stores 4 bits of data.

The memory cell array may include a plurality of memory blocks. Each of the memory blocks may include a plurality of memory cells, Each memory block may include a plurality of pages. According to an embodiment, a page may be a unit for storing data in the memory device 100 or reading data stored in the memory device 100.

A memory block may be a unit for erasing data. According to an embodiment, examples of the memory device 100 may include a Double Data Rate Synchronous Dynamic Random Access Memory (DDR SDRAM), a Low Power Double Data Rate4 (LPDDR4) SDRAM, a Graphics Double Data Rate (DDDR) SDRAM, a Low Power DDR (LPDDR) SDRAM, a Rambus Dynamic Random Access Memory (RDRAM), a NAND flash memory, a vertical NAND flash memory, a NOR flash memory device, a resistive random access memory (RRAM), a phase-change random access memory (PRAM), a magnetoresistive random access memory (MRAM), a ferroelectric random access memory (FRAM), or a spin transfer torque random access memory (STT-RAM). For convenience of explanation, it is assumed that the memory device 100 is a NAND flash memory.

The memory device 100 may receive a command and an address from the memory controller 200 and access an area selected in response to the address in the memory cell array. That is, the memory device 100 may perform an operation corresponding to the command on the area selected in response to the address. For example, the memory device 100 may perform a write operation (program operation), a read operation, and an erase operation. During a program operation, the memory device 100 may program data into the area selected in response to the address. During a read operation, the memory device 100 may read data from the area selected by the address. During an erase operation, the memory device 100 may erase data from the area selected by the address.

The memory controller 200 may control general operations of the storage device 50.

When power is applied to the storage device 50, the memory controller 200 may execute firmware FW, When the memory device 100 is a flash memory device, the memory controller 200 may execute firmware such as a Flash Translation Layer (FTL) for controlling communication between the host and the memory device 100.

According to an embodiment, the memory controller 200 may receive data and a logical block address (LBA) from the host and convert the logical block address (LBA) into a physical block address (PBA) indicating an address of memory cells in which data included in the memory device 100 is stored.

The memory controller 200 may control the memory device 100 to perform a program operation, a read operation, or an erase operation in response to a request from the host. During a program operation, the memory controller 200 may provide a write command, a physical block address, and data to the memory device 100. During a read operation, the memory controller 200 may provide a read command and a physical block address to the memory device 100. During an erase operation, the memory controller 200 may provide an erase command and a physical block address to the memory device 100.

According to an embodiment, the memory controller 200 may generate and transfer a command, an address, and data to the memory device 100 regardless of a request from the host. For example, the memory controller 200 may provide a command, an address, and data to the memory device 100 to perform background operations, such as a program operation for wear leveling and a program operation for garbage collection.

According to an embodiment, the memory controller 200 may control at least two memory devices 100. The memory controller 200 may control the memory devices 100 according to an interleaving scheme to improve operation performance. The interleaving scheme may refer to an operating scheme by which operating periods of at least two memory devices 100 overlap with each other.

The host may communicate with the storage device 50 using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

Figure 2:
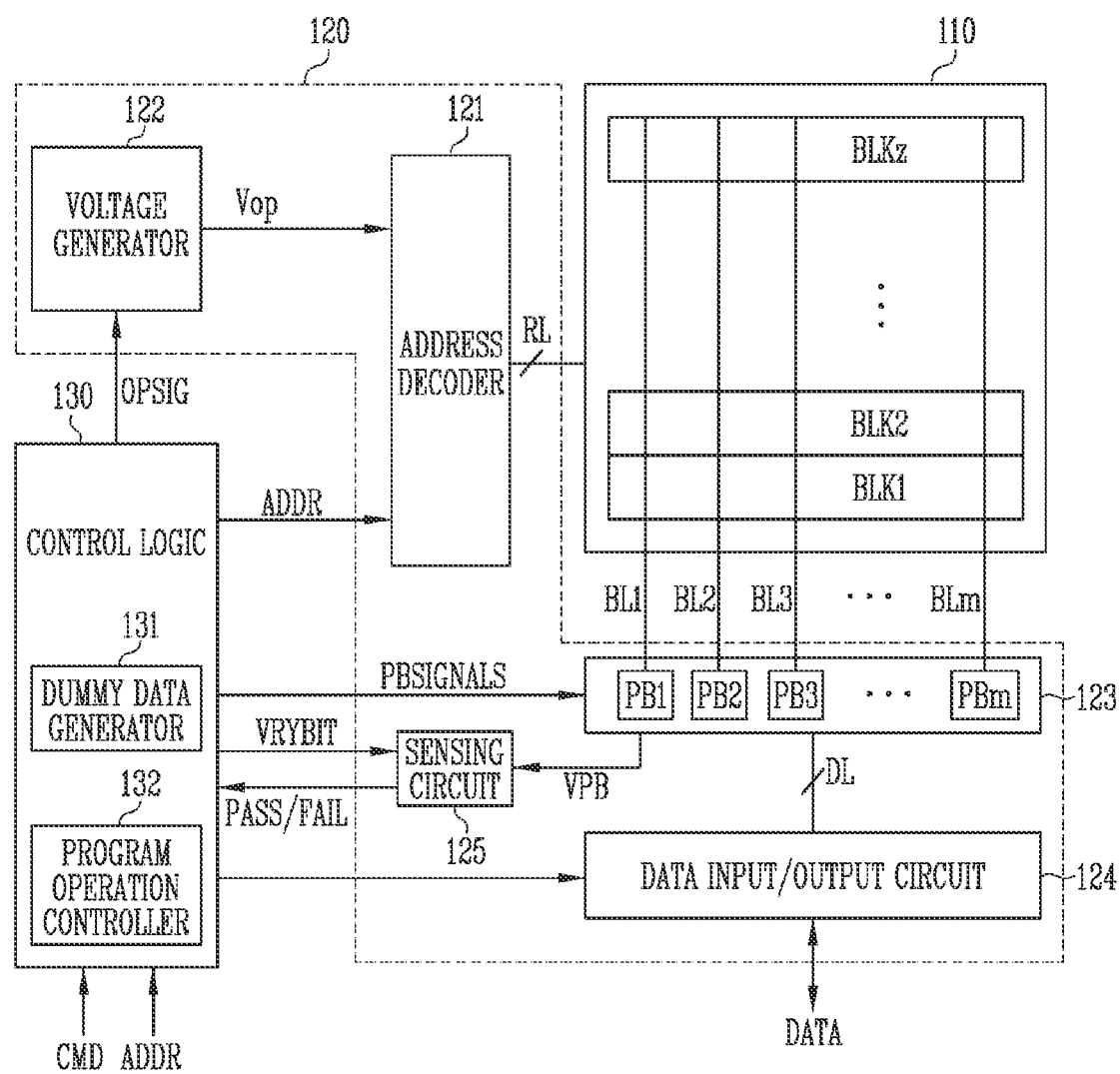
FIG. 2 is a diagram illustrating the structure of a memory device of FIG. 1.

FIG. 2 is a diagram illustrating the structure of the memory device 100 of FIG. 1.

Referring to FIG. 2, the memory device 100 may include a memory cell array 110, a peripheral circuit 120, and control logic 130. The control logic 130 may be implemented as hardware, software, or a combination of hardware and software. For example, the control logic 130 may be a control logic circuit operating in accordance with an algorithm and/or a processor executing control logic code.

The memory cell array 110 may include a plurality of memory blocks, i.e., first to zth memory blocks BLK1 to BLKz. The plurality of memory blocks BLK1 to BLKz may be coupled to an address decoder 121 through row lines RL.

The memory blocks BLK1 to BLKz may be coupled to a read and write circuit 123 through bit lines BL1 to BLm. Each of the plurality of memory blocks BLK1 to BLKz may include a plurality of memory cells. According to an embodiment, a plurality of memory cells may be non-volatile memory cells. Among the plurality of memory cells, memory cells coupled to the same word line may be defined as one page. In other words, the memory cell array 110 may include a plurality of pages. According to an embodiment, each of the plurality of memory blocks BLK1 to BLKz included in the memory cell array 110 may include a plurality of dummy cells. One or more dummy cells may be coupled in series between a drain select transistor and memory cells and between a source select transistor and memory cells.

Each of the memory cells of the memory device 100 may include a single level cell (SLC) storing a single data bit, a multi level cell (MLC) storing two data bits, a triple level cell (TLC) storing three data bits, and a quad level cell (QLC) storing four data bits.

The peripheral circuit 120 may include the address decoder 121, a voltage generator 122, the read and write circuit 123, a data input/output circuit 124, and a sensing circuit 125.

The peripheral circuit 120 may drive the memory cell array 110, For example, the peripheral circuit 120 may drive the memory cell array 110 to perform a program operation, a read operation and an erase operation.

The address decoder 121 may be coupled to the memory cell array 110 through the row lines RL. The row lines RL may include drain select lines, word lines, source select lines, and a common source line. According to an embodiment of the present disclosure, the word lines may include normal word lines and dummy word lines. According to an embodiment, the row lines RL may further include a pipe select line.

The address decoder 121 may be configured to operate in response to control of the control logic 130. The address decoder 121 may receive an address ADDR from the control logic 130.

The address decoder 121 may be configured to decode a block address of the received address ADDR. The address decoder 121 may select at least one memory block among the memory blocks BLK1 to BLKz according to the decoded block address. The address decoder 121 may be configured to decode the row address from the received address ADDR. The address decoder 121 may select at least one word line among word lines of the selected memory block according to the decoded row address. The address decoder 121 may apply an operation voltage Vop supplied from the voltage generator 122 to the selected word line.

During a program operation, the address decoder 121 may apply a program voltage to the selected word line and a program pass voltage having a lower voltage level than the program voltage to unselected word lines. During a program verify operation, the address decoder 121 may apply a verify voltage to the selected word line and a verify pass voltage having a greater voltage level than the verify voltage to the unselected word lines.

During a read operation, the address decoder 121 may apply a read voltage to the selected word line and a read pass voltage having a greater voltage level than the read voltage to unselected word lines.

According to an embodiment of the present disclosure, the memory device 100 may perform an erase operation on each memory block. During the erase operation, the address ADDR which is input to the memory device 100 may include a block address. The address decoder 121 may decode the block address and select at least one of the memory blocks according to the decoded block address, During the erase operation, the address decoder 121 may apply a ground voltage to word lines input to the selected memory block.

According to an embodiment, the address decoder 121 may be configured to decode a column address of the transferred address ADDR. The decoded column address may be transferred to the read and write circuit 123, For example, the address decoder 121 may include components such as a row decoder, a column decoder and an address buffer.

The voltage generator 122 may be configured to generate a plurality of operating voltages Vop by using an external power voltage supplied to the memory device 100. The voltage generator 122 may be controlled by the control logic 130.

According to an embodiment, the voltage generator 122 may generate an internal power voltage by regulating the external power voltage. The internal power voltage generated by the voltage generator 122 may be used as an operating voltage for the memory device 100.

According to an embodiment, the voltage generator 122 may generate the plurality of voltages Vop by using the external power voltage or the internal power voltage. The voltage generator 122 may be configured to generate various voltages required by the memory device 100. For example, the voltage generator 122 may generate a plurality of erase voltages, a plurality of program voltages, a plurality of pass voltages, a plurality of selected read voltages, and a plurality of unselected read voltages.

The voltage generator 122 may include a plurality of pumping capacitors receiving the internal power voltage to generate the plurality of operating voltages Vop having various voltage levels, and may generate the plurality of operating voltages Vop by selectively activating the plurality of pumping capacitors in response to control of the control logic 130.

The plurality of operating voltages Vop may be supplied to the memory cell array 110 by the address decoder 121.

The read and write circuit 123 may include first to mth page buffers PB1 to PBm. The first to mth page buffers PB1 to PBm may be coupled to the memory cell array 110 through the first to mth bit lines BL1 to BLm, respectively. The first to mth page buffers PB1 to PBm may operate in response to the control of the control logic 130.

The first to mth page buffers PB1 to PBm may communicate data DATA with the data input/output circuit 124. During a program operation, the first to mth page buffers PB1 to PBm may receive the data DATA to be stored through the data input/output circuit 124 and data lines DL.

During a program operation, when a program voltage is applied to the selected word line, the first to mth page buffers PB1 to PBm may transfer the data DATA received through the data input/output circuit 124 to the selected memory cells through the bit lines BL1 to BLm. The memory cells of the selected page may be programmed according to the transferred data DATA. A memory cell coupled to a bit line to which a program permission voltage (e.g., a ground voltage) is applied may have an increased threshold voltage. A threshold voltage of a memory cell coupled to a bit line to which a program inhibition voltage (for example, a power voltage) is applied may be maintained, During a program verify operation, the first to mth page buffers PB1 to PBm may read the data DATA stored in the memory cells through the bit lines BL1 to BLm from the selected memory cells.

During a read operation, the read and write circuit 123 may read the data DATA from the memory cells of the selected page through bit lines BL and output the read data DATA to the data input/output circuit 124.

During an erase operation, the read and write circuit 123 may float the bit lines BL. According to an embodiment, the read and write circuit 123 may include a column selector.

The data input/output circuit 124 is coupled to the first to mth page buffers PB1 to PBm through the data lines DL. The data input/output circuit 124 may operate in response to control of the control logic 130.

The data input/output circuit 124 may include a plurality of input/output buffers (not shown) that receive the input data DATA. During a program operation, the data input/output circuit 124 may receive the data DATA to be stored from an external controller (not shown). During a read operation, the data input/output circuit 124 may output the data DATA transferred from the first to mth page buffers PB1 to PBm included in the read and write circuit 123 to the external controller.

The sensing circuit 125 may generate a reference current in response to an allowable bit signal VRYBIT generated by the control logic 130, and may compare a sensing voltage VPB received from the read and write circuit 123 with a reference voltage generated by the reference current to output a pass signal or a fail signal during a read operation or a verify operation.

The control logic 130 may be coupled to the address decoder 121, the voltage generator 122, the read and write circuit 123, the data input/output circuit 124, and the sensing circuit 125. The control logic 130 may be configured to control the general operations of the memory device 100. The control logic 130 may operate in response to a command CMD transferred from an external device.

The control logic 130 may control the peripheral circuit 120 by generating various signals in response to the command CMD and the address ADDR. For example, the control logic 130 may output an operation signal OPSIG, the address ADDR, read and write control signals PBSIGNALS, and the allowable bit VRYBIT in response to the command CMD and the address ADDR. The control logic 130 may output the operation signal OPSIG to the voltage generator 122, output the address ADDR to the address decoder 121, output a read and write control signal to the read and write circuit 123, and output the allowable bit VRYBIT to the sensing circuit 125. In addition, the control logic 130 may determine whether a verify operation passes or fails in response to the pass or fail signal PASS/FAIL output by the sensing circuit 125.

According to an embodiment, the address decoder 121 may include a pass switch circuit that couples global word lines and local word lines to be described below with reference to FIG. 7, The operation voltage Vop generated by the voltage generator 122 may be applied to the global word lines. The local word lines may be coupled to a memory block. The local word lines as shown in FIG. 2 may include the row lines RL.

The address decoder 121 may apply a block selection signal to the pass switch circuit on the basis of the address ADDR received from the control logic 130. When the pass switch circuit is turned on in response to the applied block selection signal, the operation voltage Vop applied to the global word lines may be transferred to the local word lines.

According to an embodiment, the peripheral circuit 120 may include a pass switch circuit that couples a plurality of local word lines and a plurality of global word lines, and may perform a read operation on a memory block. As a channel potential of the memory block that is boosted to a negative voltage by a word line discharge operation that is included in a read operation as described below with reference to FIG. 13 is recovered to a ground voltage level, the peripheral circuit 120 may discharge potential levels of the plurality of local word lines to the ground voltage level.

The control logic 130 may control the peripheral circuit 120 to discharge the potential levels of the plurality of local word lines by increasing a leakage current of the pass switch circuit when the memory device 100 enters a ready state after the read operation. The memory device 100 may be in a busy state during a read operation, or in a ready state when the read operation is completed.

The pass switch circuit may include a plurality of pass transistors that couple the plurality of local word lines and the plurality of global word lines, respectively. The pass switch circuit may increase the leakage current of the pass transistor by precharging body regions of the plurality of pass transistors to a positive voltage, or floating the body regions of the pass transistors.

Figure 3:
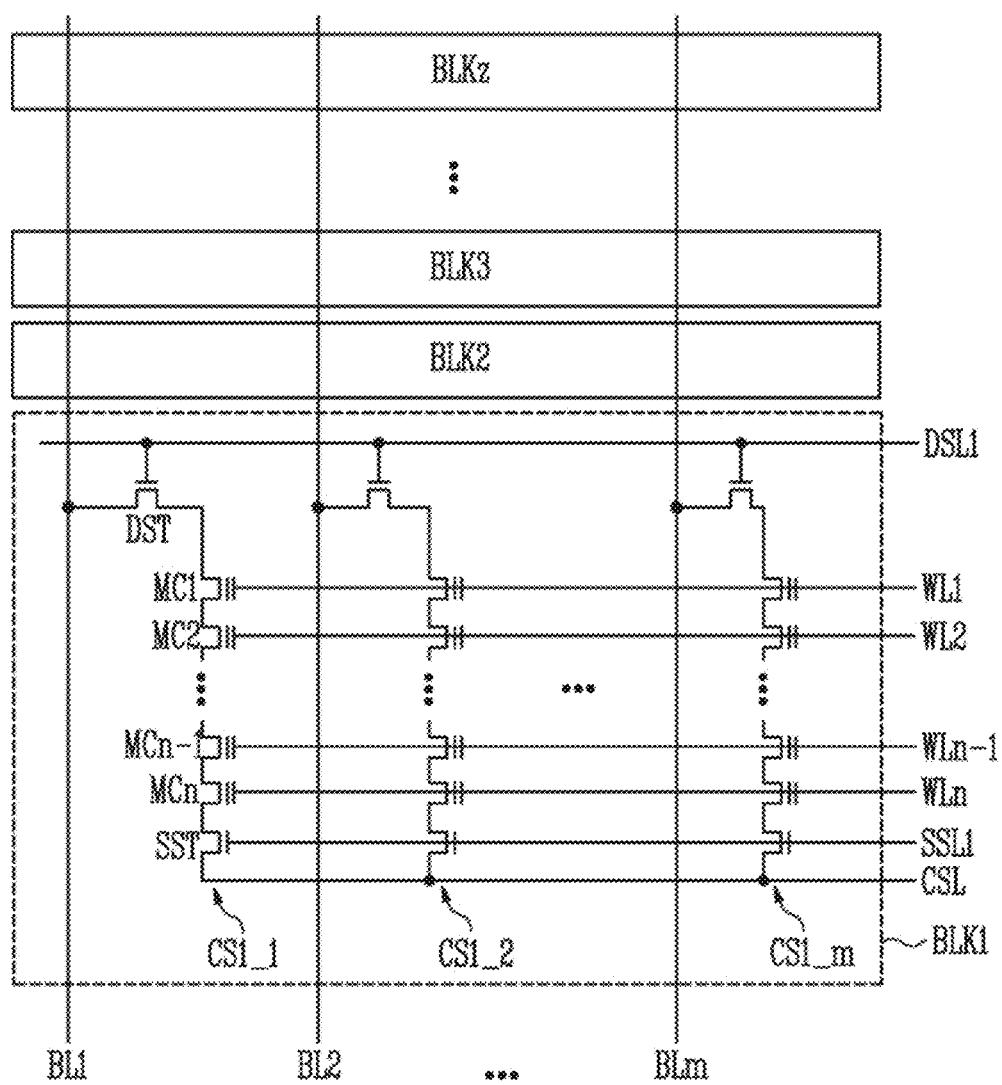
FIG. 3 is a diagram illustrating the structure of a memory cell array of FIG. 2.

When the memory device 100 enters the ready state, the pass switch circuit may apply a block selection signal having a low voltage level to a gate of each of the plurality of pass transistors, and may apply a positive voltage to, or float the body regions of the plurality of pass transistors, FIG. 3 is a diagram illustrating the structure of the memory cell array 110 of FIG. 2.

Referring to FIG. 3, the first to zth memory blocks BLK1 to BLKz may be commonly coupled to the first to mth bit lines BL1 to BLm. In FIG. 3, for convenience of explanation, components included in the first memory block BLK1, among the plurality of memory blocks BLK1 to BLKz, are illustrated, and components included in the second to zth memory blocks BLK2 to BLKz may be omitted. Each of the remaining memory blocks BLK2 to BLKz may be configured in substantially the same manner as the first memory block BLK1.

The first memory block BLK1 may include a plurality of first to mth cell strings CS1_1 to CS1_m, where m is a positive integer, Each of the first to mth cell strings CS1_1 to CS1_m may be coupled to the first to mth bit lines BL1 to BLm, respectively. Each of the first to mth cell strings CS1_1 to CS1_m may include a drain select transistor DST, a plurality of memory cells MC1 to MCn coupled in series, and a source select transistor SST, wherein n is a positive integer.

A gate terminal of the drain select transistor DST included in each of the first to mth cell strings CS1_1 to CS1_m may be coupled to a first drain select line DSL1, Gate terminals of the first to nth memory cells MC1 to MCn included in each of the first to mth cell strings CS1_1 to CS1_m may be coupled to first to nth word lines WL1 to WLn, respectively. A gate terminal of the source select transistor SST included in each of the first to mth cell strings CS1_1 to CS1_m may be coupled to a source select line SSL1.

For convenience of explanation, the structure of a cell string is described on the basis of the first cell string CS1_1, among the plurality of cell strings CS1_1 to CS1_m. However, it is understood that each of the remaining cell strings CS1_2 to CS1_m may be configured in the same manner as the first cell string CS1_1.

A drain terminal of the drain select transistor DST included in the first cell string CS1_1 may be coupled to the first bit line BL1. A source terminal of the drain select transistor DST included in the first cell string CS1_1 may be coupled to a drain terminal of the first memory cell MC1 included in the first cell string CS1_1. The first to nth memory cells MC1 to MCn may be coupled in series with each other. A drain terminal of the source select transistor SST included in the first cell string CS1_1 may be coupled to a source terminal of the nth memory cell MCn included in the first cell string CS1_1. A source terminal of the source select transistor SST included in the first cell string CS1_1 may be coupled to a common source line CSL, According to an embodiment, the common source line CSL may be commonly connected to the first to zth memory blocks BLK1 to BLKz.

The drain select line DSL1, the first to nth word lines WL1 to WLn, and the source select line SSL1 may be included in the row lines RL as shown in FIG. 2. The drain select line DSL1, the first to nth word lines WL1 to WLn, and the source select line SSL1 may be controlled by the address decoder 121. The common source line CSL may be controlled by the control logic 130. The first to nth bit lines BL1 to BLm may be controlled by the read and write circuit 123.

Figure 4:
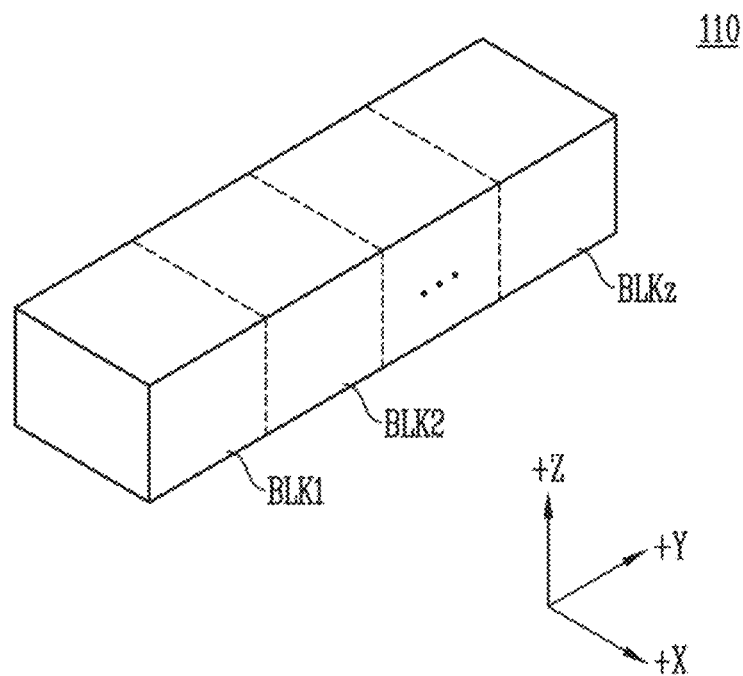
FIG. 4 is a diagram Illustrating another embodiment of a memory cell array of FIG. 2.

FIG. 4 is a diagram illustrating another embodiment of the memory cell array 110 of FIG. 2.

Referring to FIG. 4, the memory cell array 110 may include a plurality of memory blocks BLK1 to BLKz. Each memory block may have a three-dimensional structure. Each memory block may include a plurality of memory cells that are stacked over a substrate. The plurality of memory cells may be arranged in +X direction, +Y direction and +Z direction, A structure of each memory block will be described with reference to FIGS. 5 and 6.

Figure 5:
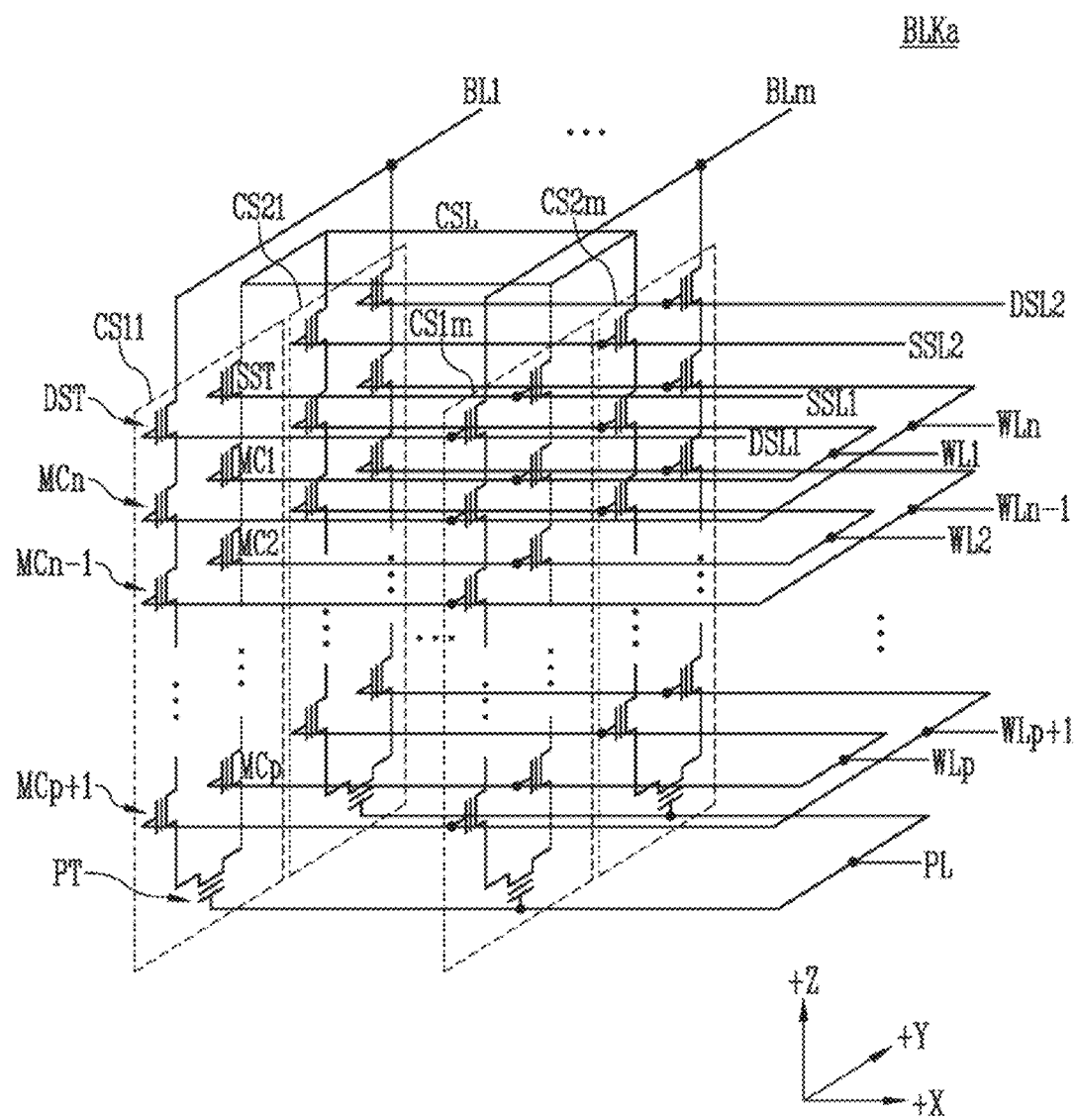
FIG. 5 is a circuit diagram illustrating one memory block (BLKa) of the memory blocks BLK1 to BLKz shown in FIG. 4.

FIG. 5 is a circuit diagram illustrating one memory block (BLKa) among the memory blocks BLK1 to BLKz shown in FIG. 4.

Referring to FIG. 5, the memory block BLKa may include a plurality of cell strings CS11 to CS1m and CS21 to CS2m, According to an embodiment, each of the plurality of cell strings CS11 to CS1m and CS21 to CS2m may be formed in a shape. In the memory block BLKa, cell strings may be arranged in a row direction (i.e., +X direction). FIG. 5 illustrates two cell strings arranged in a column direction (i.e., +Y direction). However, it is understood that three or more cell strings may be arranged in the column direction.

According to an embodiment, one memory block may include a plurality of sub-blocks. One sub-block may include cell strings that are arranged in a 'U' shape in one row.

Each of the cell strings CS11 to CS1m and CS21 to CS2m may include at least one source select transistor SST, first to nth memory cells MC1 to MCn, a pipe transistor PT, and at least one drain select transistor DST.

Each of the source and drain select transistors SST and DST and each of the memory cells MC1 to MCn may have similar structures to each other. According to an embodiment, each of the source and drain select transistors SST and DST and the memory cells MC1 to MCn may include a channel layer, a tunneling insulating layer, a charge storage layer, and a blocking insulating layer. According to an embodiment, a pillar for providing a channel layer may be provided in each cell string. According to an embodiment, a pillar for providing at least one of the channel layer, the tunneling insulating layer, the charge storage layer, and the blocking insulating layer may be provided to each cell string.

The source select transistor SST of each cell string may be coupled between the common source line CSL and first to nth memory cells MC1 to MCn.

According to an embodiment, source select transistors of cell strings arranged in the same row may be coupled to a source select line extending in a row direction, and source select transistors of cell strings arranged in different rows may be coupled to different source select lines. In FIG. 5, the source select transistors SST of the cell strings CS11 to CS1m in the first row may be coupled to a first source select line SSL1. The source select transistors SST of the cell strings CS21 to CS2m in the second row may be coupled to a second source select line SSL2.

According to another embodiment, the source select transistors SST of the cell strings CS11 to CS1m and CS21 to CS2m may be coupled in common to one source select line.

The first to nth memory cells MC1 to MCn of each cell string may be coupled between the source select transistor SST and the drain select transistor DST.

The first to nth memory cells MC1 to MCn may be divided into first to pth memory cells MC1 to MCp and (p+1)th to nth memory cells MCp+1 to MCn. The first to pth memory cells MC1 to MCp may be sequentially arranged in a reverse direction to the +Z direction and may be coupled in series between the source select transistor SST and the pipe transistor PT. The (p+1)th to nth memory cells MCp+1 to MCn may be sequentially arranged in the +Z direction and may be coupled in series between the pipe transistor PT and the drain select transistor DST. The first to pth memory cells MC1 to MCp and the (p+1)th to nth memory cells MCp+1 to MCn may be coupled through the pipe transistor PT, Gates of the first to nth memory cells MC1 to MCn of each cell string may be coupled to first to nth word lines WL1 to WLn, respectively.

A gate of the pipe transistor PT of each cell string may be coupled to a pipe line PL.

The drain select transistor DST of each cell string may be coupled between the corresponding bit line and the memory cells MCp+1 to MCn, Cell strings arranged in the row direction may be coupled to a drain select line extending in the row direction. The drain select transistors of the cell strings CS11 to CS1m in the first row may be coupled to a first drain select line DSL1. The drain select transistors DST of the cell strings CS21 to CS2m in the second row may be coupled to a second drain select line DSL2.

Cell strings arranged in the column direction may be coupled to a bit line that extends in the column direction. In FIG. 5, the cell strings CS11 and CS21 in the first column may be coupled to the first bit line BL1, The cell strings CS1m and CS2m in an mth column may be coupled to the mth bit line BLm.

Memory cells coupled to the same word line in cell strings arranged in the row direction may form a single page. For example, memory cells coupled to the first word line WL1 in the cell strings CS11 to CS1m in the first row may constitute a single page. Memory cells coupled to the first word line WL1 in the cell strings CS21 to CS2m in the second row may constitute another page. When one of the drain select lines DSL1 and DSL2 is selected, cell strings arranged in one row direction may be selected. When one of the first to nth word lines WL1 to WLn is selected, one page may be selected from the selected cell strings.

According to another embodiment, even bit lines and odd bit lines may replace the first to mth bit lines BL1 to BLm. In addition, even cell strings of the cell strings CS11 to CS1m or CS21 to CS2m arranged in the row direction may be coupled to even bit lines, respectively, and odd cell strings of the cell strings CS11 to CS1m or CS21 to CS2m arranged in the row direction may be coupled to odd bit lines, respectively.

According to an embodiment, at least one of the first to nth memory cells MC1 to MCn may serve as a dummy memory cell. For example, one or more dummy memory cells may be provided to reduce an electric field between the source select transistor SST and the memory cells MC1 to MCp. Alternatively, one or more dummy memory cells may be provided to reduce an electric field between the drain select transistor DST and the memory cells MCp+1 to MCn. When more dummy memory cells are provided, the operational reliability of the memory block BLKa may be improved, whereas the size of the memory block BLKa may be increased. On the other hand, when the number of dummy memory cells decreases, the size of the memory block BLKa may be reduced, and the operational reliability of the memory block BLKa may be reduced.

In order to efficiently control one or more dummy memory cells, each of the dummy memory cells may have a required threshold voltage. Before or after an erase operation on the memory block BLKa, program operations may be performed on a portion or entirety of the dummy memory cells. When an erase operation is performed after a program operation is performed, dummy memory cells may have required threshold voltages by controlling voltages applied to dummy word lines coupled to the respective dummy memory cells.

Figure 6:
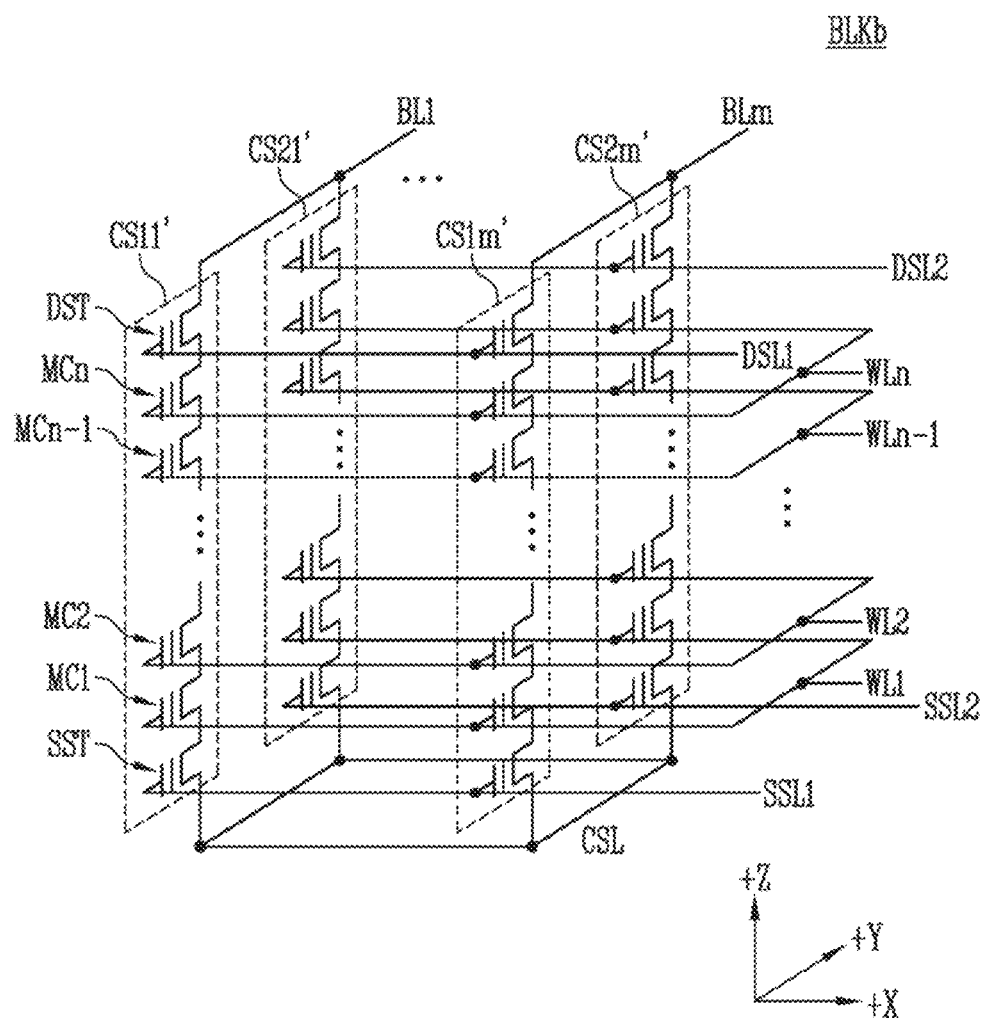
FIG. 6 is a circuit diagram illustrating another memory block (BLKb) of the memory blocks BLK1 to BLKz shown in FIG. 4.

FIG. 6 is a circuit diagram illustrating another memory block (BLKb) among the memory blocks BLK1 to BLKz shown in FIG. 4.

Referring to FIG. 6, the memory block BLKb may include a plurality of cell strings CS11' to CS1m' and CS21' to CS2m'. Each of the plurality of cell strings CS11' to CS1m' and CS21' to CS2m' may extend in the +Z direction. Each of the plurality of cell strings CS11' to CS1m' and CS21' to CS2m' may include at least one source select transistor SST, the first to nth memory cells MC1 to MCn, and at least one drain select transistor DST, which are stacked on a substrate (not shown) under a memory block BLK1'.

According to an embodiment, one memory block may include a plurality of sub-blocks. One sub-block may include cell strings that are arranged in an 'I' shape in one row.

The source select transistor SST of each cell string may be coupled between the common source line CSL and the first to nth memory cells MC1 to MCn. Source select transistors of cell strings arranged in the same row may be coupled to the same source select line. The source select transistors SST of the cell strings CS11' to CS1m' arranged in the first row may be coupled to the first source select line SSL1. The source select transistors SST of the cell strings CS21' to CS2m' arranged in the second row may be coupled to the second source select line SSL2. According to another embodiment, the source select transistors SST of the cell strings CS11' to CS1m' and CS21' to CS2m' may be commonly coupled to a single source select line.

The first to nth memory cells MC1 to MCn of each cell string may be coupled in series between the source select transistor SST and the drain select transistor DST. Gates of the first to nth memory cells MC1 to MCn may be coupled to the first to nth word lines WL1 to WLn, respectively.

The drain select transistor DST of each cell string may be coupled between a corresponding bit line and the memory cells MCp+1 to MCn. Drain select transistors of cell strings arranged in a row direction may be coupled to a drain select line extending in the row direction. The drain select transistors DST of the cell strings CS11' to CS1m' in the first row may be coupled to the first drain select line DSL1, The drain select transistors DST of the cell strings CS21' to CS2m' in the second row may be coupled to the second drain select line DSL2.

As a result, the memory block BLKb shown in FIG. 6 may have a similar equivalent circuit to the memory block BLKa shown in FIG. 5 except that the pipe transistor PT is removed from each cell string of the memory block BLKb.

According to another embodiment, even bit lines and odd bit lines may replace the first to mth bit lines BL1 to BLm. In addition, even cell strings of the cell strings CS11' to CS1m' or CS21' to CS2m' arranged in the row direction may be coupled to even bit lines, respectively, and odd cell strings of the cell strings CS11' to CS1m' or CS21' to CS2m' arranged in the row direction may be coupled to odd bit lines, respectively.

According to an embodiment, at least one of the first to nth memory cells MC1 to MCn may serve as a dummy memory cell. For example, one or more dummy memory cells may be provided to reduce an electric field between the source select transistor SST and the first to nth memory cells MC1 to MCn. Alternatively, one or more dummy memory cells may be provided to reduce an electric field between the drain select transistor DST and the memory cells MC1 to MCn. When more dummy memory cells are provided, the operational reliability of the memory block BLKb may be improved, whereas the size of the memory block BLKb may be increased. On the other hand, when fewer memory cells are provided, the size of the memory block BLKb may be reduced, whereas the operational reliability of the memory block BLKb may be degraded.

In order to efficiently control one or more dummy memory cells, each of the dummy memory cells may have a required threshold voltage. Before or after an erase operation on the memory block BLKb, program operations may be performed on a portion or entirety of the dummy memory cells. When an erase operation is performed after a program operation is performed, dummy memory cells may have required threshold voltages by controlling voltages applied to dummy word lines coupled to the respective dummy memory cells.

Figure 7:
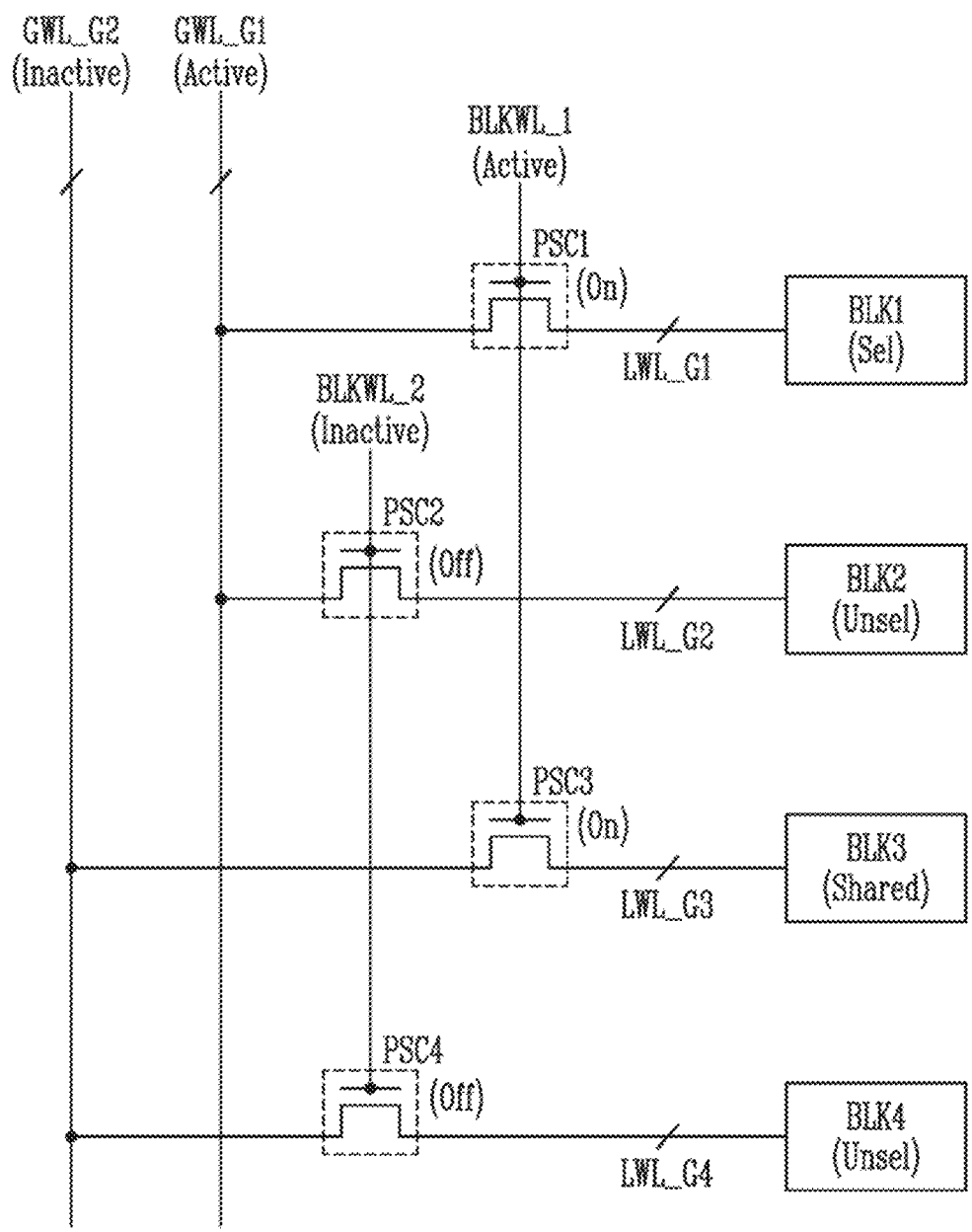
FIG. 7 is a diagram illustrating a global word line and a local word line.

FIG. 7 is a diagram illustrating global word lines and local word lines.

Referring to FIG. 7, a local word line group may include a plurality of local word lines that are coupled to a memory block. A global word line group may include a plurality of global word lines that are coupled to the plurality of local word lines through pass switch circuits.

A first local word line group LWL_G1 may include local word lines that are coupled to the first memory block BLK1. A second local word line group LWL_G2 may include local word lines that are coupled to the second memory block BLK2. A third local word line group LWL_G3 may include local word lines that are coupled to a third memory block BLK3. A fourth local word line group LWL_G4 may include local word lines that are coupled to a fourth memory block BLK4.

A local word line group may be coupled to a global word line group through a pass switch circuit.

The first local word line group LWL_G1 may be coupled to a first global word line group GWL_G1 through a first pass switch circuit PSC1. The second local word line group LWL_G2 may be coupled to the first global word line group GWL_G1 through a second pass switch circuit PSC2. The third local word line group LWL_G3 may be coupled to a second global word line group GWL_G2 through a third pass switch circuit PSC3. The fourth local word line group LWL_G4 may be coupled to the second global word line group GWL_G2 through a fourth pass switch circuit PSC4.

Voltages associated with a memory operation may be applied to an activated global word line. The memory operation may include a read operation, a program operation, an erase operation, and the like. The voltages associated with the memory operation that are applied to the activated global word line group may be transferred to the corresponding local word line group through the corresponding pass switch circuit.

In FIG. 7, the first global word line group GWL_G1 may be activated and the second global word line group GWL_G2 may be deactivated. The voltages associated with the memory operation may be applied to the first global word line group GWL_G1. On the other hand, the voltages associated with the memory operation might not be applied to the second global word line group GWL_G2.

A block selection signal may be applied to pass switch circuits. A first block selection signal BLKWL_1 may be applied to the first and third pass switch circuits PSC1 and PSC3. A second block selection signal BLKWL_2 may be applied to the second and fourth pass switch circuits PSC2 and PSC4.

The first block selection signal BLKWL_1 may be activated, and the second block selection signal BLKWL_2 may be inactivated, so that the first and third pass switch circuits PSC1 and PSC3 may be turned on, and the second and fourth pass switch circuits PSC2 and PSC4 may be turned off. In an embodiment, the first block selection signal BLKWL_1 may be turned on, and the second block selection signal BLKWL_2 may be turned off, so that the first and third pass switch circuits PSC1 and PSC3 may be turned on, and the second and fourth pass switch circuits PSC2 and PSC4 may be turned off.

Since the first pass switch circuit PSC1 is turned on, the voltages associated with the memory operation that are applied to the first global word line group GWL_G1 may be transferred to the first local word line LWL_G1. The first memory block BLK1 that is coupled to the first local word line group LWL_G1 may be a selected memory block (Sel).

Since the second pass switch circuit PSC2 is turned off, the first global word line group GWL_G1 and the second local word line group LWL_G2 may be disconnected from each other. The second memory block BLK2 that is coupled to the second local word line group LWL_G2 may be an unselected memory block (Unsel).

Although the third pass switch circuit PSC3 is turned on, the second glob& word line group GWL_G2 may be deactivated. Therefore, the third memory block BLK3 coupled to the third local word line group LWL_G3 may be a shared memory block (Shared).

Since the fourth pass switch circuit PSC4 is turned off, the second global word line group GWL_G2 and the fourth local word line group LWL_G4 may be disconnected from each other. The fourth memory block BLK4 that is coupled to the fourth local word line group LWL_G4 may be an unselected memory block (Unsel).

Figure 8:
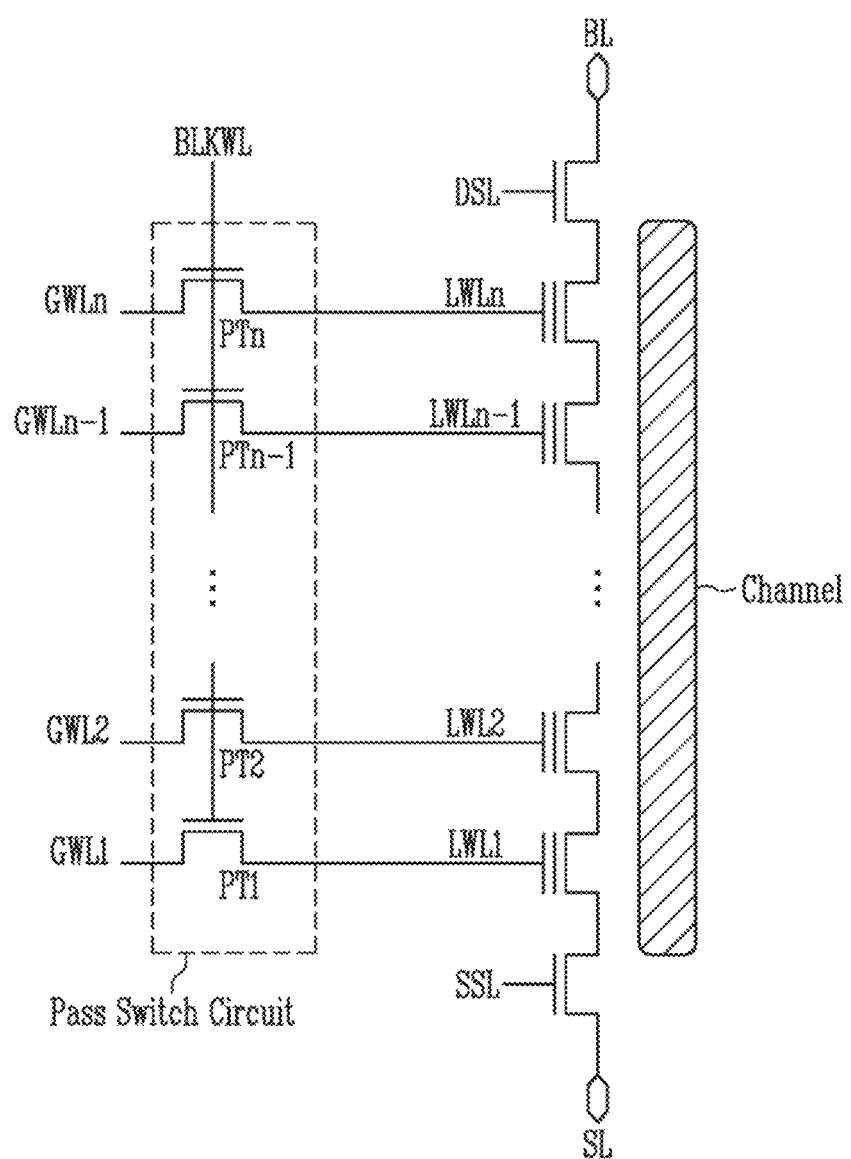
FIG. 8 is a diagram illustrating a pass switch circuit as shown in FIG. 7.

FIG. 8 is a diagram illustrating the pass switch circuit as shown in FIG. 7.

Referring to FIG. 8, a memory block may include a memory string. However, the number of memory strings included in the memory block might not be limited thereto.

The memory string may include a plurality of memory cells that are coupled in series between a drain select transistor and a source select transistor. A drain select line DSL may be coupled to a gate of the drain select transistor. A source select line SSL may be coupled to a gate of the source select transistor. A plurality of local word lines LWL1 to LWLn may be coupled to gates of the plurality of memory cells, where n is a natural number of 1 or more.

The pass switch circuit may include a plurality of pass transistors PT1 to PTn that couple the plurality of local word lines LWL1 to LWLn and the plurality of global word lines GWL1 to GWLn, respectively. A block selection signal BLKWL may be applied to gates of the plurality of pass transistors PT1 to PTn.

When the block selection signal BLKWL is in an 'on' state, a voltage applied to the plurality of global word lines GWL1 to GWLn may be transferred to the plurality of local word lines LWL1 to LWLn, respectively. When the block selection signal BLKWL is in an 'off' state, the voltage applied to the plurality of global word lines GWL1 to GWLn might not be transferred to the plurality of local word lines LWL1 to LWLn, respectively. In an embodiment, when the block selection signal BLKWL is in an 'active' state (i.e., activated), a voltage applied to the plurality of global word lines GWL1 to GWLn may be transferred to the plurality of local word lines LWL1 to LWLn, respectively. When the block selection signal BLKWL is in an 'inactive' state (i.e., inactivated), the voltage applied to the plurality of global word lines GWL1 to GWLn might not be transferred to the plurality of local word lines LWL1 to LWLn, respectively.

Figure 9:
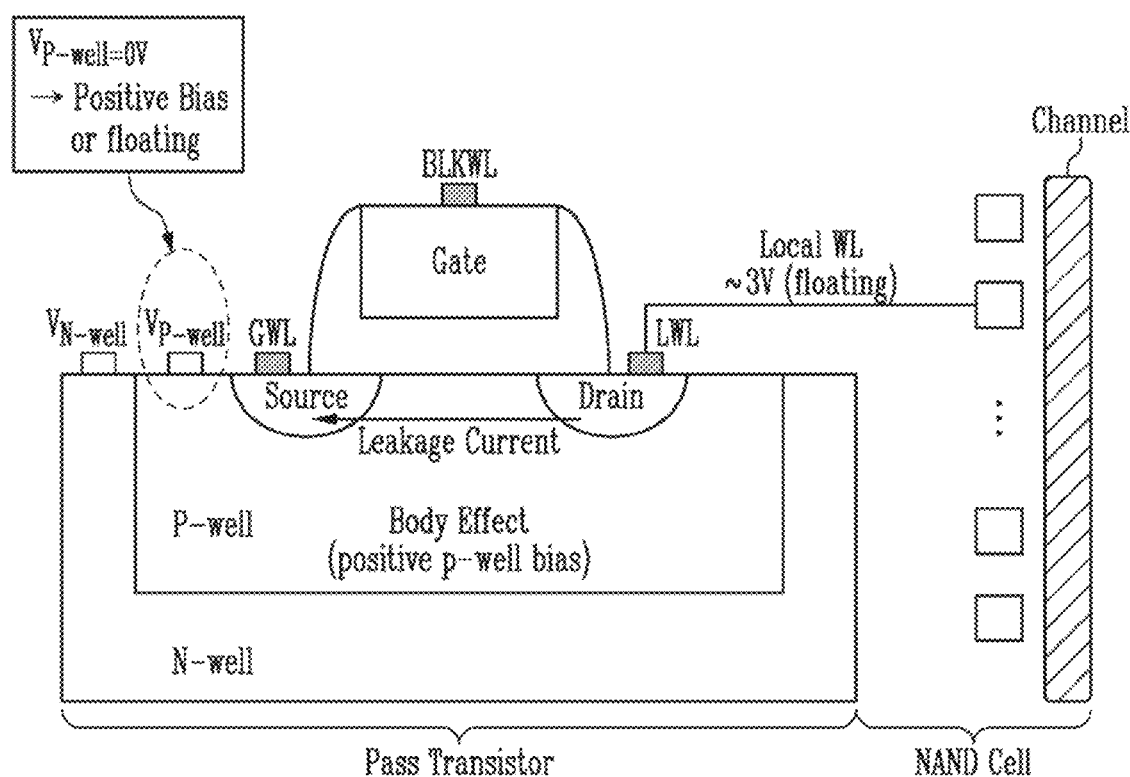
FIG. 9 is a diagram illustrating a pass transistor as shown in FIG. 8.

FIG. 9 is a diagram illustrating the pass transistor as shown in FIG. 8.

Referring to FIG. 9, the pass transistor may be an nMOSFET transistor. In another embodiment, the pass transistor may be a pMOSFET transistor.

The block selection signal BLKWL may be applied to a gate terminal of a pass transistor. A local word line LWL may be coupled to a drain terminal of the pass transistor, A global word line GWL may be coupled to a source terminal of the pass transistor. A body of the pass transistor may be a P-well.

When the block selection signal BLKWL is in an 'off' state (i.e., inactive state), the global word line GWL and the local word line LWL may be disconnected from each other. As a result, a leakage current may flow from the drain terminal coupled to the local word line LWL to the source terminal coupled to the global word line GWL. The amount of the leakage current may vary depending on a threshold voltage of the pass transistor. When the threshold voltage of the pass transistor is reduced, the leakage current may be increased.

When a transistor has the P-well body, if a positive voltage is applied to a body region of the transistor, the body effect may be caused, so that a threshold voltage of the transistor may be reduced. Since the body effect leads to the reduction in the threshold voltage of the transistor, the leakage current of the transistor may be increased.

The body effect may also occur when the body region is floated. When the local word line, which is coupled to the drain terminal and is in the floating state, is boosted to a positive voltage, the floated body region may be increased to the positive voltage due to the coupling effect. As a result, the body effect may occur.

As described below with reference to FIG. 12, the potential of the local word line may be boosted to a positive voltage after the read operation. When the potential of the local word line is boosted to the positive voltage, stress may be applied to a memory cell having a low threshold voltage (e.g., an erase cell). Therefore, it may be unnecessary to discharge the potential of the local word line to a ground voltage level to reduce stress.

According to an embodiment, the memory device may increase the leakage current of the pass transistor by applying a positive voltage to, or floating the body region of the pass transistor. By increasing the leakage current of the pass transistor, the memory device may discharge the boosted potential level of the local word line to the ground voltage level, and may reduce the stress of the memory cell. In FIG. 9 the N-well of the pass transistor is illustrated as shown.

Figure 10:
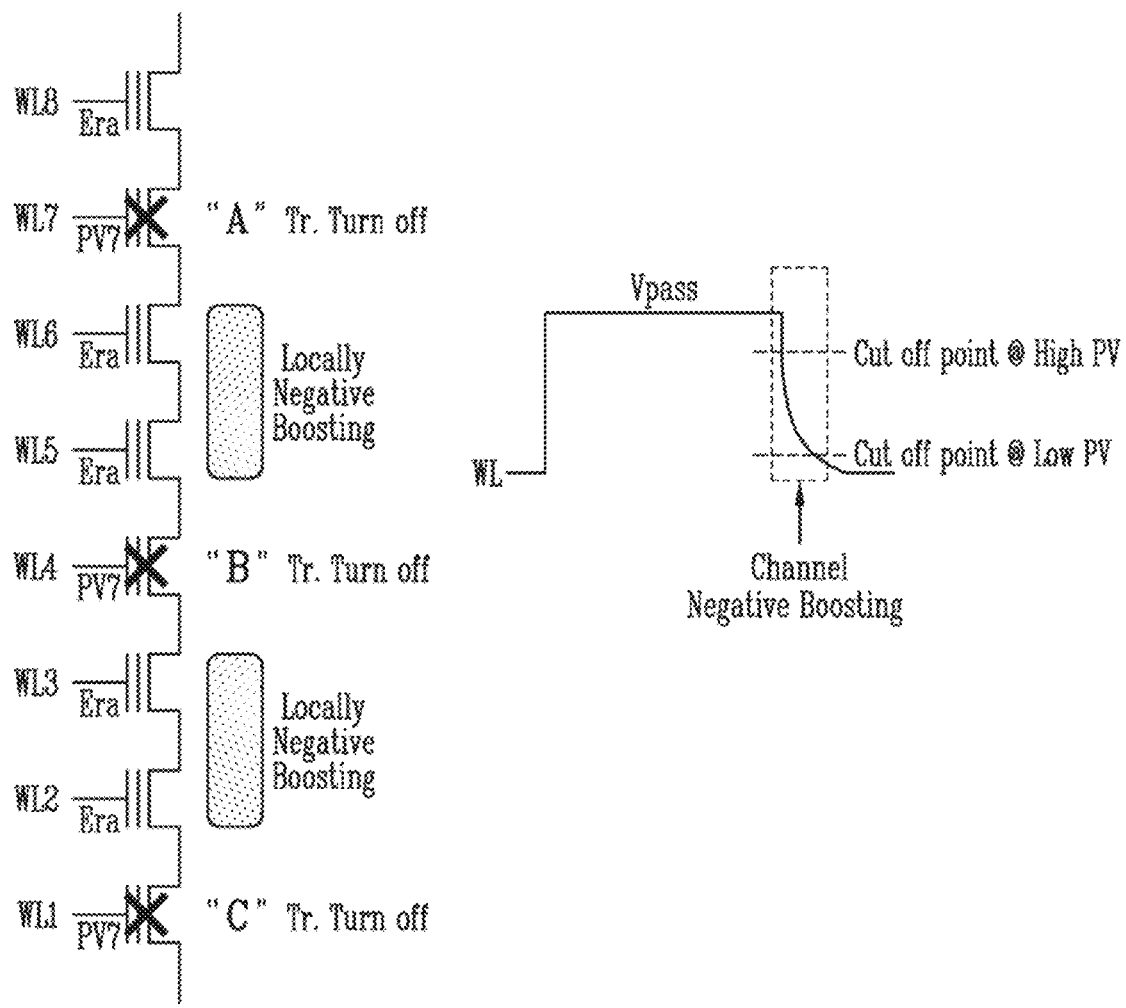
FIG. 10 is a diagram illustrating negative boosting of a channel voltage during a read operation.

FIG. 10 is a diagram illustrating negative boosting of a channel voltage during a read operation.

Referring to FIG. 10, a read operation may include a read voltage applying operation and a word line discharge operation. During the read voltage applying operation, a read voltage may be applied to a selected word line, among a plurality of word lines, and a pass voltage Vpass may be applied to unselected word lines. During the word line discharge operation, a ground voltage may be applied to the plurality of word lines.

When the word line discharge operation is performed, a current may be cut off at different times varying according to a threshold voltage of a memory cell. For example, a memory cell having a high threshold voltage may be cut off before a memory cell having a low threshold voltage.

In FIG. 10, when it is assumed that a memory cell is a triple-level cell, a memory cell having a high threshold voltage may be programmed into a seventh program state PV7 which is the highest program state. A memory cell having a low threshold voltage may be erased to an erase state Era which is the lowest program state.

When a discharge operation is performed to apply a ground voltage to first to eighth word lines WL1 to WL8, memory cells A, B and C which are coupled to the first, fourth and seventh word lines WL1, WL4, and WL7, respectively, may be turned off first (transistor (Tr.) Turn off). Channel regions between the turned-off memory cells A, B, and C may be locally floated. A voltage applied to the second, third, fifth and sixth word lines WL2, WL3, WL5, and WL6 may be reduced to a ground voltage level. The potential level of the locally floated channel regions may be boosted to a negative voltage.

In an embodiment, PV may indicate a program state defined by a program verify voltage level. For instance, a triple level cell (TLC) may be programmed into one program state among a plurality of program states (Era, PV1~PV7). A program verify voltage level corresponding to a first program state (PV1) is the lowest. A program verify voltage level corresponding to a seventh program state (PV7) is the highest.

In an embodiment, Locally Negative Boosting may mean boosting the potential level of the locally floated channel regions into the negative voltage.

Figure 11:
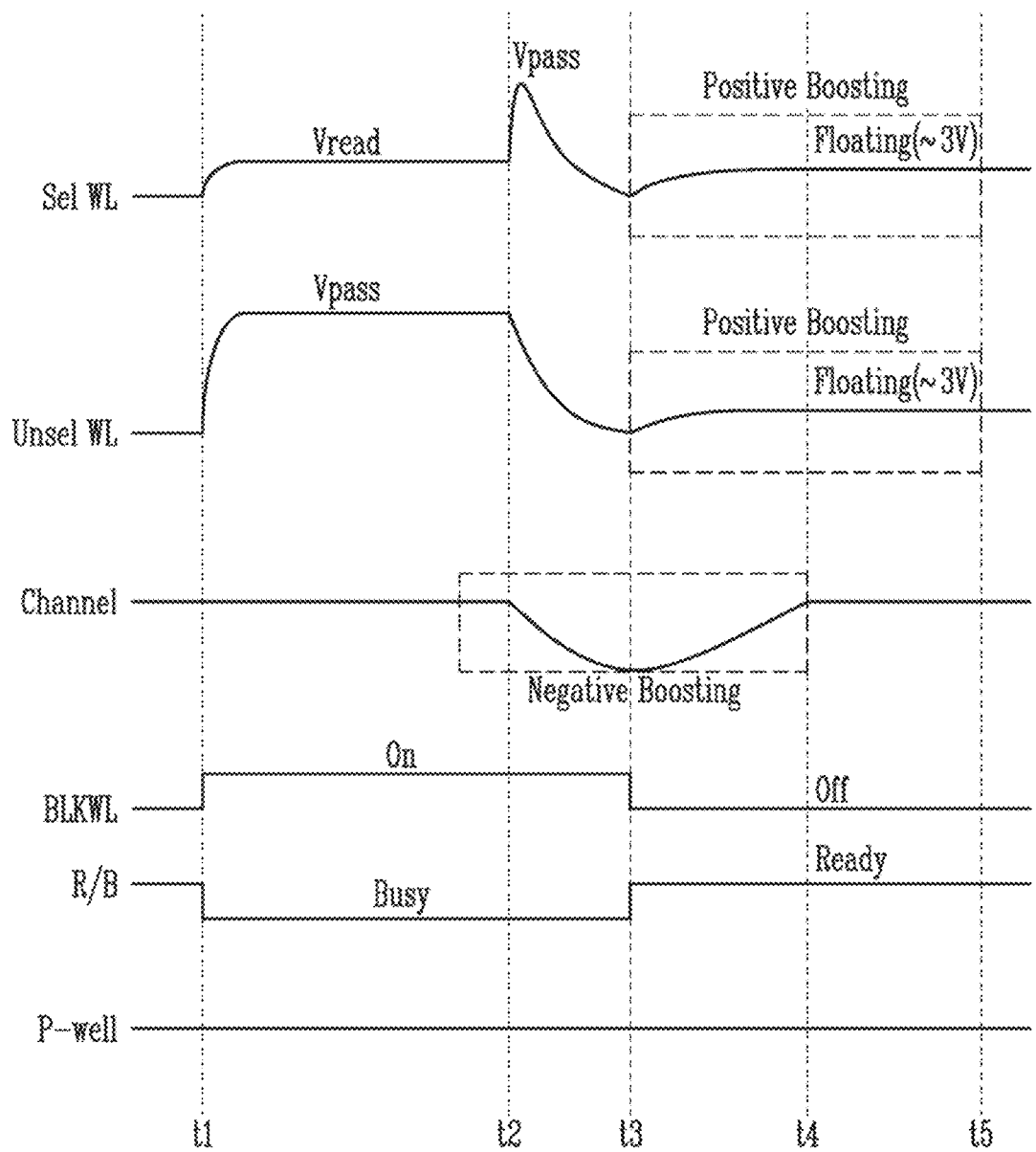
FIG. 11 is a timing diagram illustrating operations of a memory device according to an embodiment of the present disclosure.

FIG. 11 is a timing diagram illustrating operations of a memory device according to an embodiment of the present disclosure.

Referring to FIG. 11, during a period from t1 to t2, a read voltage (i.e., Vread) applying operation may be performed, During the read voltage applying operation, a read voltage may be applied to a selected word line (i.e., Sel WL) and a pass voltage (i.e., Vpass) may be applied to an unselected word line (i.e., Unsel WL).

During a period from t2 to t3, a word line discharge operation may be performed. When a word line discharge operation is performed, equalizing may be performed to reduce interference effects caused by a voltage difference between a selected word line and an unselected word line adjacent thereto. As a result of the equalizing, the potential level of the selected word line may increase to the same pass voltage as the potential level of the unselected word line, and may then be discharged to a ground voltage level, together with the unselected word line.

As described above with reference to FIG. 10, negative boosting that the potential of the channel region is reduced to a negative voltage may result from the word line discharge operation.

During a period from t3 to t4, the potential of the negatively boosted channel region may be recovered to the ground voltage level. The potential of the channel region may be recovered by the current flowing through the bit line or the common source line. As the potential of the channel region is recovered to the ground voltage level from the negative voltage, word lines in the floating state may be boosted to a positive voltage due to the coupling effect with the channel region.

In a period from t4 to t5, the word lines may be floated while being boosted to the positive voltage. Therefore, stress may be applied to a memory cell having a low threshold voltage due to the positive voltage to which the word line is boosted. For example, a memory cell in an erase state may be slightly programmed due to the positive voltage that is continuously applied. Therefore, the potential of the word line boosted to the positive voltage after the read operation is performed may need to be discharged.

When the read operation is performed during the period from t1 to t3, the block selection signal BLKWL may be activated (i.e., on), and a read/busy signal R/B may also be activated. When a read operation is being performed on the memory device, the read/busy signal R/B may become at a low level and indicate a busy state (i.e., busy). When the read operation of the memory device is completed, the read/busy signal R/B may become at a high level and indicate a ready state (i.e., ready). The ground voltage level may be applied to the body region (P-well) of the pass transistor.

Figure 12:
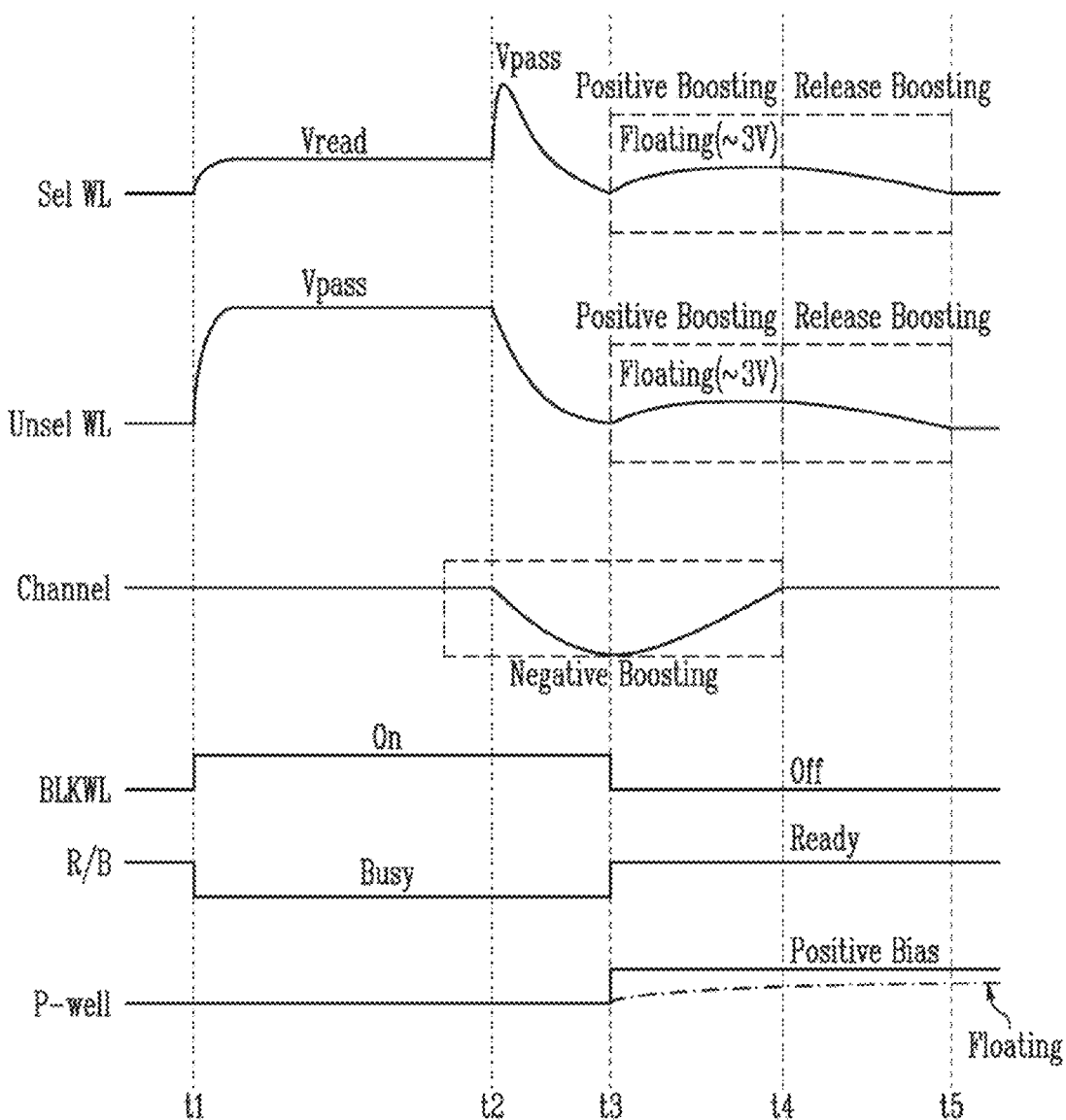
FIG. 12 is a timing diagram illustrating operations of a memory device according to an embodiment of the present disclosure.

FIG. 12 is a timing diagram illustrating operations of a memory device according to an embodiment of the present disclosure.

Referring to FIG. 12, the read operation may be performed between t1 and t3 in the same manner as described above with reference to FIG. 11.

During the period from t3 to t4, a positive voltage may be applied to the body region (P-well) of the pass transistor, or the body region of the pass transistor may be floated. When the potential of the channel region negatively boosted to the negative voltage is recovered to the ground voltage level, the potential of the word lines may be positively boosted to the positive voltage.

During the period from t4 to t5, as described above with reference to FIG. 9, the memory device may apply the positive voltage to, or float the body region (P-well) of the pass transistor. By applying the positive voltage to, or floating the body region (P-well) of the pass transistor, the body effect may result in the cause of or increase in the leakage current of the pass transistor, and the potential of the word line may be discharged to the ground voltage level.

According to an embodiment, when the potential of the word line is discharged to the ground voltage level after the read operation, program stress exerted to a memory cell having a low threshold voltage may be reduced.

FIG. 13 is a timing diagram illustrating operations of a memory device according to an embodiment of the present disclosure.

Referring to FIG. 13, at step S1301, a memory device may perform a read operation.

At step S1303, the memory device may determine whether in a ready state or not. When a read operation is completed, the memory device may determine the ready state, and the process flow may proceed to step S1305. On the other hand, when the read operation is being performed, the memory device may determine a busy state, and the process flow may proceed to step S1301. In an embodiment, a ready state is a state in which the memory device is not performing an operation such as a program operation, reading operation, writing operation, or erasing operation. In an embodiment, a busy state is a state in which the memory device is performing an operation such as a program operation, reading operation, writing operation, or erasing operation.

At step S1305, the memory device may increase a leakage current of a pass switch circuit that couples a plurality of local word lines and a plurality of global word lines, so that the memory device may discharge the potential of the plurality of local word lines to a ground voltage level.

According to the present disclosure, a memory device having improved read reclaim performance and an operating method of the memory device having the improved read reclaim performance may be provided.

What is claimed is:

1. A memory device, comprising:
a memory block coupled to a plurality of local word lines;
a peripheral circuit configured to couple the plurality of local word lines to a plurality of global word lines through a pass switch circuit and configured to perform a read operation on the memory block; and
control logic configured to control the peripheral circuit to cause or increase a leakage current of the pass switch circuit, and discharge potential levels of the plurality of local word lines using the leakage current of the pass switch circuit when the memory device enters a ready state after the read operation,
wherein the leakage current of the pass switch circuit is caused or increased by applying a positive voltage to, or floating body regions of a plurality of pass transistors in the pass switch circuit.

2. The memory device of claim 1,
wherein the pass switch circuit includes the plurality of pass transistors coupling the plurality of local word lines to the plurality of global word lines, respectively, and precharges the body regions of the plurality of pass transistors to the positive voltage, or floats the body regions of the plurality of pass transistors to cause or increase the leakage current.

3. The memory device of claim 2,
wherein the control logic controls the peripheral circuit to perform the read operation including a read voltage applying operation and a word line discharge operation,
wherein the read voltage applying operation comprises applying a read voltage to a selected local word line, among the plurality of local word lines, and applying a pass voltage to unselected local word lines, among the plurality of local word lines, and
wherein the word line discharge operation comprises applying a ground voltage to the plurality of local word lines.

4. The memory device of claim 3,
wherein the memory device is in a busy state when the read operation is being performed, and the memory device is in the ready state when the read operation is completed.

5. The memory device of claim 4,
wherein when the memory device enters the ready state, the pass switch circuit applies a block selection signal having a low level to gates of the plurality of pass transistors, and applies the positive voltage to, or floats the body regions of the plurality of pass transistors.

6. The memory device of claim 3,
wherein the peripheral circuit discharges the potential levels of the plurality of local word lines boosted to the positive voltage to a ground voltage level as a channel potential of the memory block boosted to a negative voltage is recovered to the ground voltage level.

7. The memory device of claim 6,
wherein the potential levels of the plurality of local word lines are discharged to the ground voltage level as the leakage current of the plurality of pass transistors is caused or increased.

8. The memory device of claim 7,
wherein each of the plurality of local word lines is coupled to a drain terminal of each of the plurality of pass transistors, and
wherein each of the plurality of global word lines is coupled to at least two source terminals of the plurality of pass transistors.

9. The memory device of claim 2,
wherein each of the plurality of pass transistors is a negative metal-oxide semiconductor (NMOS) transistor or a positive metal-oxide semiconductor (PMOS) transistor.

10. A method of operating a memory device, the method comprising:
performing a read operation on a memory block coupled to a plurality of local word lines; and
causing or increasing a leakage current of a pass switch circuit coupling the plurality of local word lines to a plurality of global word lines by applying a positive voltage to, or floating body regions of a plurality of pass transistors in the pass switch circuit; and
discharging potential levels of the plurality of local word lines using the leakage current of the pass switch circuit when the memory device enters a ready state.

11. The method of claim 10, wherein the performing of the read operation comprises:
performing a read voltage applying operation of applying a read voltage to a selected local word line, among the plurality of local word lines, and applying a pass voltage to unselected local word lines, among the plurality of local word lines; and
performing a word line discharge operation of applying a ground voltage to the plurality of local word lines.

12. The method of claim 11,
wherein the pass switch circuit includes the plurality of pass transistors coupling the plurality of local word lines to the plurality of global word lines, respectively.

13. The method of claim 12,
wherein the causing or increasing of the leakage current comprises precharging the body regions of the plurality of pass transistors to the positive voltage, or floating the body regions of the plurality of pass transistors.

14. The method of claim 13, further comprising setting the memory device to a busy state when the read operation is being performed, and setting the memory device to the ready state when the read operation is completed.

15. The method of claim 14, wherein the causing or increasing of the leakage current comprises:
applying a block selection signal having a low level to gates of the plurality of pass transistors when the memory device enters the ready state; and
applying the positive voltage to the body regions of the plurality of pass transistors, or floating the body regions of the plurality of pass transistors.

16. The method of claim 12, wherein the discharging of the potential levels of the plurality of local word lines comprises discharging the potential levels of the plurality of local word lines boosted to the positive voltage to a ground voltage level when a channel potential of the memory block boosted to a negative voltage by the word discharge operation is recovered to the ground voltage level.

17. The method of claim 16,
wherein the potential levels of the plurality of local word lines are discharged to the ground voltage level as the leakage current of the plurality of pass transistors is caused or increased.

18. The method of claim 17,
wherein each of the plurality of local word lines is coupled to a drain terminal of each of the plurality of pass transistors, and each of the plurality of global word lines is coupled to at least two source terminals of the plurality of pass transistors.

19. The method of claim 12,
wherein each of the plurality of pass transistors is a negative metal-oxide semiconductor (NMOS) transistor or a positive metal-oxide semiconductor (PMOS) transistor.

* * * * *